United States Patent
Benzel et al.

(10) Patent No.: US 7,858,424 B2
(45) Date of Patent: Dec. 28, 2010

(54) METHOD FOR MANUFACTURING A SENSOR ARRAY INCLUDING A MONOLITHICALLY INTEGRATED CIRCUIT

(75) Inventors: Hubert Benzel, Pliezhausen (DE); Simon Armbruster, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/992,329

(22) PCT Filed: Sep. 25, 2006

(86) PCT No.: PCT/EP2006/066687

§ 371 (c)(1),
(2), (4) Date: Feb. 9, 2009

(87) PCT Pub. No.: WO2007/036504

PCT Pub. Date: Apr. 5, 2007

(65) Prior Publication Data

US 2009/0142873 A1 Jun. 4, 2009

(30) Foreign Application Priority Data

Sep. 27, 2005 (DE) .................. 10 2005 046 058

(51) Int. Cl.
*H01L 21/00* (2006.01)
(52) U.S. Cl. ............ 438/53; 257/418; 257/E27.006; 257/E21.456; 257/E21.125; 438/542
(58) Field of Classification Search ............ 438/53, 438/542, 510; 257/418, E27.006, E21.456, 257/E21.125, E21.323
See application file for complete search history.

(56) References Cited

U.S. PATENT DOCUMENTS 4,618,397 A * 10/1986 Shimizu et al. ............ 438/53

FOREIGN PATENT DOCUMENTS

| DE | 199 57 556 |   | 5/2001 |
|----|------------|---|--------|
| JP | 05-304304  | * | 11/1993 |
| JP | 06-291335  | * | 10/1994 |

OTHER PUBLICATIONS

Asao et al , JP 05-304304, Translation of the Japanese Patent, pp. 1-8,(1993).*
Kato, JP 06-291335, Translationof the Japanese Patent, pp. 1-19 (1994).*
Udrea, F.; Gardner, J.W.; , "SOI CMOS gas sensors," *Sensors, 2002. Proceedings of IEEE* , vol. 2, No., pp. 1379-1384 vol. 2, 2002.
Yoon, E.; Wise, K.D.; , "A monolithic RMS-DC converter using planar diaphragm structures," *Electron Devices Meeting, 1989. IEDM '89. Technical Digest., International*, vol., No., pp. 491-494, Dec. 3-6 1989.

(Continued)

*Primary Examiner*—Caridad M Everhart
(74) *Attorney, Agent, or Firm*—Kenyon & Kenyon LLP

(57) ABSTRACT

A method for producing a sensor array including a monolithically integrated circuit is described as well as a sensor array. This sensor array has a micromechanical sensor structure, in which a first partial structure which is associated with the sensor structure is produced at the same time as a second partial structure which is associated with the circuit, a process variation of the first partial structure being performed in order to adjust a structure property of the sensor structure while the second partial structure remains the same.

6 Claims, 4 Drawing Sheets

OTHER PUBLICATIONS

Tadigadapa, S.; , "Integration of micromachined devices and microelectronic circuits: techniques and challenges," *Circuits and Systems, 2000. Proceedings of the 43rd IEEE Midwest Symposium on,* vol. 1, No., pp. 224-227 vol. 1, 2000.

* cited by examiner

METHOD FOR MANUFACTURING A SENSOR ARRAY INCLUDING A MONOLITHICALLY INTEGRATED CIRCUIT

This application is a National Stage Entry of PCT/EP2006/066687 filed Sep. 25, 2006 which claims foreign priority benefit of German application 10/2005046058.5 filed Sep. 27, 2005.

FIELD OF THE INVENTION

The present invention is directed to a method for manufacturing a sensor array including a monolithically integrated circuit.

BACKGROUND INFORMATION

A semiconductor pressure sensor in which a sensor element together with an electronic analyzer may be integrated on a chip is discussed in DE 199 57 556 A1. One disadvantage of such integrated arrays is often the fact that to manufacture such an integrated array of a circuit and a micromechanical sensor structure, they must be manufactured or structured, one after the other, which increases the number of mask levels and in general increases the complexity in manufacturing such a sensor array. To reduce costs in manufacturing such a sensor array, there have been efforts to manufacture at least parts of the circuit simultaneously with parts of the sensor array.

However, it is a disadvantage here that certain structural properties such as certain dimensions of the sensor structure, e.g., the thickness of a sensor diaphragm or the like, are not freely controllable due to the coupling of circuit-relevant processes and sensor structure-relevant processes, because when such a structural property is altered, e.g., with a change in the thickness of a diaphragm layer, the circuit part of the sensor array no longer functions either properly or for its entire lifetime because when the process variation is performed with a view toward the sensor structure, it has the effect in the circuit part of the sensor array that the thickness of certain doping regions, for example, is no longer adequate to achieve insulation or the like, for example.

SUMMARY OF THE INVENTION

The method according to the present invention for manufacturing a sensor array comprising a monolithically integrated circuit and the sensor array according to the present invention as defined by the features of the other independent claims have the advantage over the related art that the manufacturing processes may be optimized with regard to the circuit as well as the micromechanical sensor structure independently of one another. For example, if a certain mask level results in the production of a certain doping which supplies an insulation doping in the circuit part and which causes a doping region in the sensor structure to define an etch stop for reproducibly uniform production of a diaphragm of a certain thickness in the sensor structure, then it is possible according to the present invention for the structural property of thickness of the diaphragm of the sensor structure to be variable—e.g., adjustable for different pressure ranges of the sensor array—and nevertheless to follow an always uniform doping in the circuit area of the sensor array.

According to one variant of the method according to the present invention, a first partial structure allocated to the sensor structure has a first doping area and a second partial structure allocated to the circuit has a second doping area, the first partial structure being created simultaneously with the second partial structure and a first dopant concentration introduced into the first doping area is lower on the average in comparison with a second dopant concentration introduced into the second doping area. This has the advantage that process variation and therefore optimization of the process sequences required for production of the sensor structure may be performed by using simple means without having to alter the process sequences with regard to the circuit of the sensor array.

The first partial structure may be a first doping area and the second partial structure to be a second doping area and for the structural property to be a certain dimension of the sensor structure. This has the advantage that the method may be implemented in a simple, reproducible, and robust manner by using simple manufacturing steps for manufacturing micromechanical components, i.e., for manufacturing semiconductor circuits, e.g., different doping areas or different doping levels or the like. It is provided here in particular according to the present invention that the dopant concentration ultimately to be established in the finished sensor array is formed by using a diffusion process which takes place at an elevated temperature in the areas of the sensor array that are already doped.

In addition, the process variation may be accomplished by varying the first dopant concentration, which is introduced into the first doping area and is lower on the average than the second dopant concentration introduced into the second doping area. The total quantity of dopants introduced into the doping areas may thus be adjusted between the first doping area and the second doping area, which results in a thicker doping layer or a thinner doping layer after a diffusion step, for example. According to the present invention, the first partial structure and the second partial structure may be manufactured using the same mask level. This has the important advantage that manufacturing costs for creating the sensor array may be reduced because one and the same mask, i.e., one and the same mask level, may be used for manufacturing the circuit and for manufacturing the sensor structure.

Furthermore, according to the present invention for the first dopant concentration may be introduced into the first doping area via a lattice-like structuring of the first partial structure, the lattice-like structuring being provided via alternating first partial areas and second partial areas, the second dopant concentration being introduced first into the first partial areas and no dopant being introduced into the second partial areas. It is possible in this way to control the total amount of dopants introduced into the first doping area by varying the geometric dimensions of the various partial areas into which different dopant concentrations may be introduced.

Another subject matter of the present invention is a sensor array having a monolithically integrated circuit and a micromechanical sensor structure, a first partial structure associated with the sensor structure having a first doping area and a second partial structure associated with the circuit having a second doping area, production of the first partial structure occurring simultaneously with production of the second partial structure and a first dopant concentration introduced into the first doping area being lower on the average than the second dopant concentration introduced into the second doping area. In this way it is possible using particularly simple means to make available a process variation for creating a variation in a structural property of the sensor structure, in particular a certain dimension of the sensor structure, by varying the first dopant concentration using simple means in particular. The first dopant concentration may be accomplished via a lattice-like structuring of the first partial structure provided in the first doping area, the lattice-like structuring being designed via alternating first partial areas of a higher dopant concentration and second partial areas of a lower dopant concentration. In this way it is possible using simple means to vary the first dopant concentration which occurs on the average in the first doping area.

Exemplary embodiments of the present invention are depicted in the drawing and are explained in greater detail in the following description.

DETAILED DESCRIPTION

Figure 1:
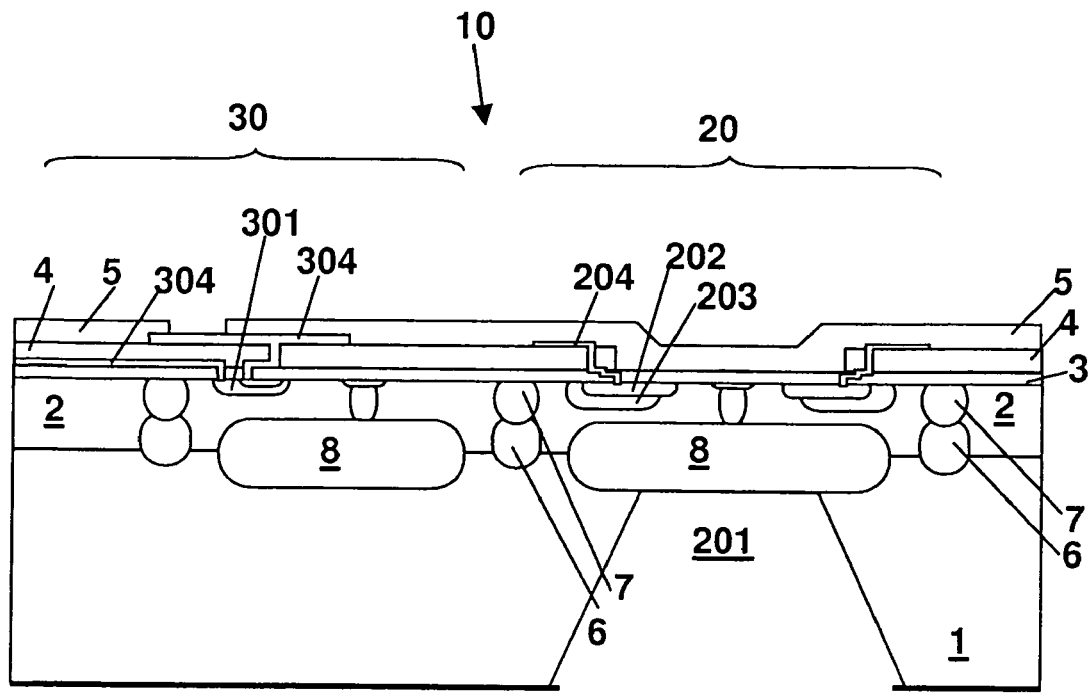
FIGS. 1 and 2 each show a cross section through a known sensor array having an integrated circuit and a micromechanical sensor structure.
Figure 2:
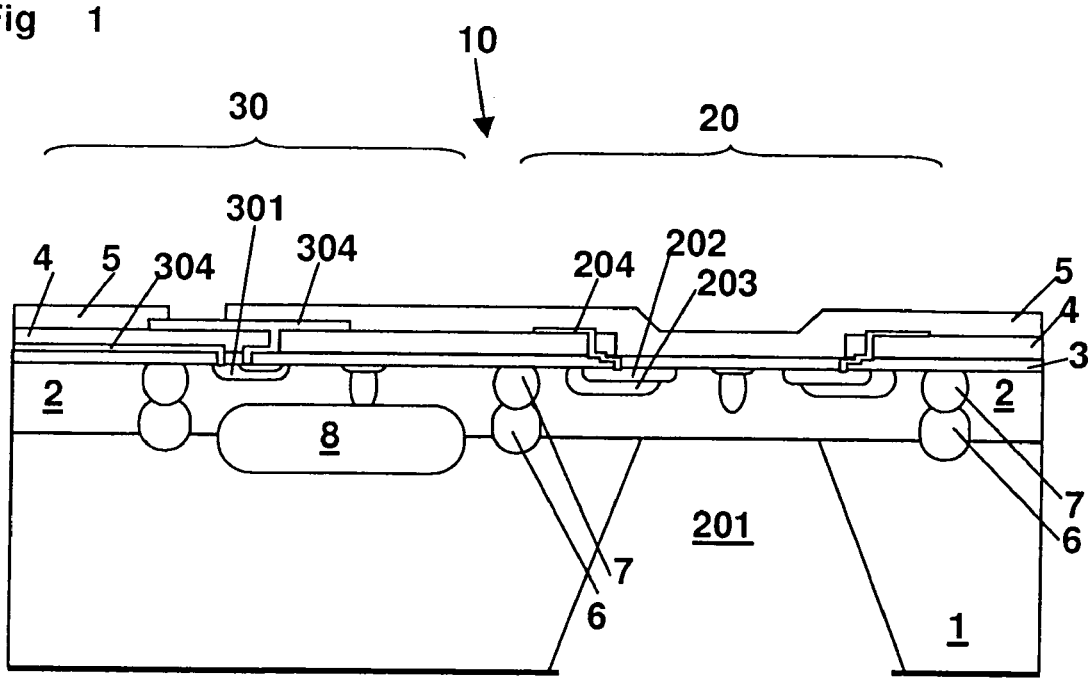

FIGS. 1 and 2 show a cross-sectional diagram of a known sensor array 10, where micromechanical structure 20 together with a circuit part 30, i.e., electronic circuit 30, is monolithically integrated. Sensor structure 20 has, for example, a cavity 201 above which a diaphragm structure is indicated, which includes different areas and supplies an electrical signal 4 in response to a change in pressure or in general in response to a change in force on one side (top or bottom) of the diaphragm. Integrated electronic circuit 30, which is indicated in the left part of FIG. 1 and FIG. 2, is provided according to the present invention for triggering the measuring equipment inside sensor structure 20, analyzing the signals thereof, and performing the processing—e.g., equalization or adaptation or the like. Sensor array 10 is constructed on a substrate 1, i.e., a substrate material 1, substrate material 1 being in particular a semiconductor material, e.g., single-crystal silicon material.

An epitaxial layer 2, for example, may be applied over substrate material 1, likewise which may be made of a semiconductor material, in particular silicon. Above epitaxial layer 2 there is an insulation layer 3, for example, made of silicon dioxide material or some other insulating layer. For electrical insulation of various contacting lines and for protecting sensor array 10 or sensor 10, other insulation layers, e.g., a first nitride layer 4 and a second nitride layer 5, may be provided. Additional doping 6, 7 and 8, which is needed for the function of circuit 30 or sensor structure 20, is likewise introduced into substrate material 1. The doping labeled with reference numeral 6, for example, is a so-called bottom insulation; the doping labeled with reference numeral 7 is an upper insulation and the doping labeled with reference numeral 8 is a buried layer doping.

A circuit element having functional areas 301 in the traditional manner is shown in the left-hand part of FIG. 1 as an example of circuit 30, where various parts of the circuit element are connected to other parts of circuit 30 by contacting lines 304. Likewise, a measuring element 202 is provided in a known way inside the diaphragm structure and above cavity 201 in the area of sensor structure 20 in the right-hand part of FIG. 1, a force exerted on one side of the diaphragm resulting in a deflection of same, which in turn results in an analyzable signal as a result of material tension in the area of measuring element 202. To this end, sensor structure 20 includes in particular insulation or feeder areas 203 and a contacting line 204 for connection of measuring element 202.

The elements of the sensor array described so far are known from the related art and are repeated in the following figures, although they are not identified again individually.

According to the exemplary embodiments and/or exemplary methods of the present invention, bottom insulation 6 (second exemplary embodiment, FIG. 5) and buried layer doping 8 (first exemplary embodiment, FIG. 3) may assume the functions of first or second partial structures 21, 31 and of first or second doping areas 25, 35, respectively.

Figure 3:
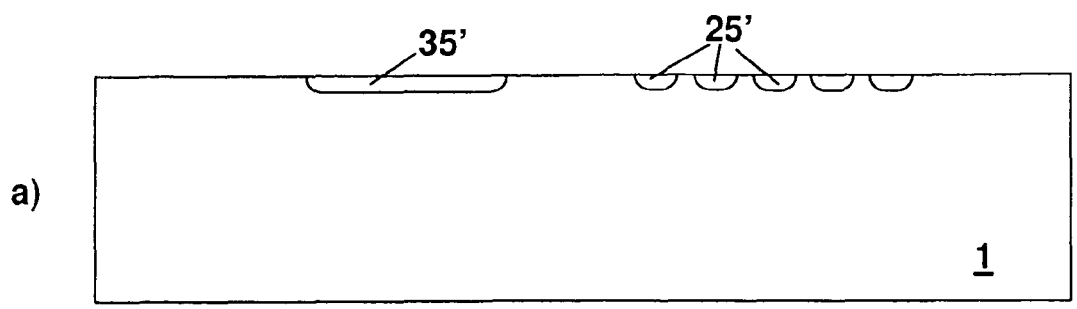
FIG. 3 shows sectional diagrams to illustrate process steps for creating a first specific embodiment of a sensor structure according to the present invention.
Figure 3:
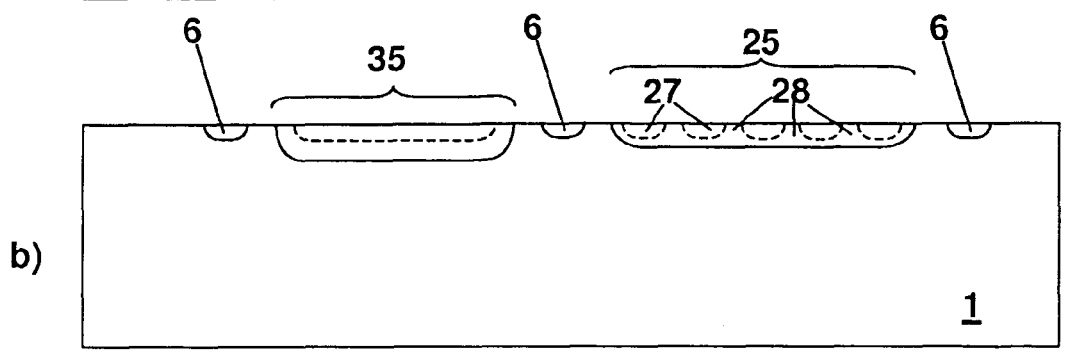
Figure 3:
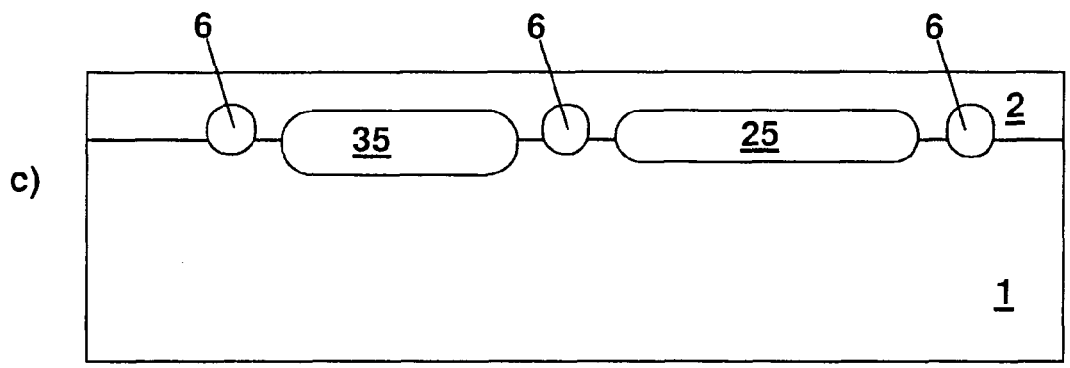
Figure 3:
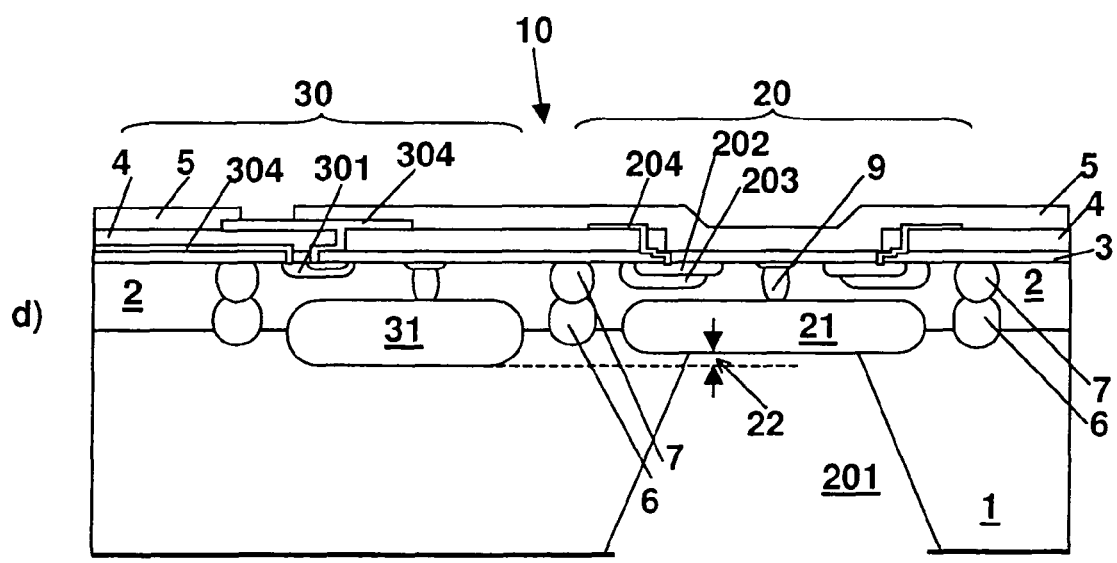

The sensor arrays depicted in FIGS. 1 and 2 have buried layer doping 8 in their circuit part 30, for example, assuming the function of second partial structure 31 or second doping area 35 in the first exemplary embodiment of the present invention (FIG. 3). According to the exemplary embodiments and/or exemplary methods of the present invention, this buried layer doping 8 (or second partial structure 31) is absolutely essential for the function of circuit 30 and a variation in buried layer doping 8 would have a deleterious effect on the functioning of circuit 30. In the example of FIG. 1, it is clear that a doping 8 is introduced by the same manufacturing step as that used for buried layer doping 8 in the area of sensor structure 20 (in particular to achieve low manufacturing costs of the sensor array); in the first exemplary embodiment of the present invention (FIG. 3), this doping assumes the function of first partial structure 21 or first doping area 25. This doping 8 in the area of sensor structure 20 has the function of adjusting a certain structural property of the sensor structure, e.g., a dimension of the sensor structure such as a thickness of the sensor diaphragm or the like. To optimize the manufacturing process for creating sensor structure 20, it may be necessary to vary the structural property, i.e., the thickness of a diaphragm, for example, to be able to detect different pressures with a high measurement sensitivity in particular. Such a variation in a structural property cannot be varied by varying the thickness of doping 8, for example, in the known sensor arrays according to FIGS. 1 and 2, because this would have effects on circuit part 30 of sensor array 10 since they are created simultaneously.

Therefore, in the related art, expensive indirect approaches (e.g., using a special doping) must be developed and the structural property could not be varied at all or could be varied only inadequately. Doping 8 has been omitted completely from FIG. 2, and, an etching mask or a structuring mask has been used in the creation of buried layer doping 8 (for the circuit part) in such a way that no doping 8 is created in the area of sensor structure 20. As a result, instead of doping 8 (as in FIG. 1), the junction between substrate material 1 and epitaxial layer 2 at which an etch stop for etching of cavity 201 may also be provided is used as an etch stop to create cavity 201 (in particular KOH etching having a PN junction as an etch stop). In this way, however, it is possible only to implement either a very thick diaphragm (see FIG. 1) or a very thin diaphragm (see FIG. 2), so that no diaphragm thicknesses between these two extremes are possible, e.g., for providing a pressure sensor in the transition range between high and low pressures.

FIG. 3 shows a schematic diagram of a first specific embodiment of a method according to the present invention which results in the production of a first specific embodiment of a sensor array 10 according to the present invention (FIG. 3d), where the diaphragm thickness is variable. FIG. 3a shows first an intermediate stage for manufacturing sensor array 10 according to the present invention, a first precursor doping 25' of a first doping area and a second precursor doping 35' of a second doping area being introduced into substrate material 1. FIG. 3b illustrates the situation after a diffusion process is performed (in particular a thermal diffusion process), a first doping area 25 and a second doping area 35 being formed, starting from precursor dopings 25', 35'. Within first doping area 25 it is apparent that it includes first partial areas 27 and second partial areas 28, a dopant having a first dopant concentration being introduced into first partial areas 27 (corresponding to first precursor doping 25') simultaneously with the implementation of second precursor doping 35'.

No dopant is introduced into second partial areas 28, which appear alternatingly between or beside first partial areas 27, simultaneously with the doping of second precursor doping 35'. For first doping area 25, this has the result in comparison with second doping area 35 that on the average, a first dopant concentration 26 which is lower than in second doping area 35 having a second dopant concentration 36 is adjusted within first doping area 25. The different dopant concentrations introduced in first and second doping areas 25, 35 and, in particular, the different dopant quantities have the effect that first doping area 25 has a lower depth of penetration into the substrate material than second doping area 35. This produces an etch stop at a different height in the manufacturing of cavity 201 by etching of the back side, in particular by KOH etching, i.e., to implement a different diaphragm thickness.

FIG. 3c illustrates the situation after applying epitaxial layer 2. First doping area 25 retains its smaller thickness, i.e., depth in substrate material 1, in comparison with the thickness of second doping area 35.

FIG. 3d illustrates the first specific embodiment of sensor array 10 according to the present invention. In comparison with the array in FIG. 1 in which a completely parallel processing was performed to produce first partial structure 21 and second partial structure 31, the smaller thickness of first doping area 25 in FIG. 3 has the effect that the thickness of the sensor diaphragm is reduced by the difference in length, which is labeled with reference numeral 22. To implement the etch stop on the underside of first doping area 25 or on the underside of first partial structure 21, a contacting area 9 is provided according to the exemplary embodiments and/or exemplary methods of the present invention, implementing a comparatively low-resistance connection of first partial structure 21 to a contact surface (not shown) or a connecting line.

Figure 4:
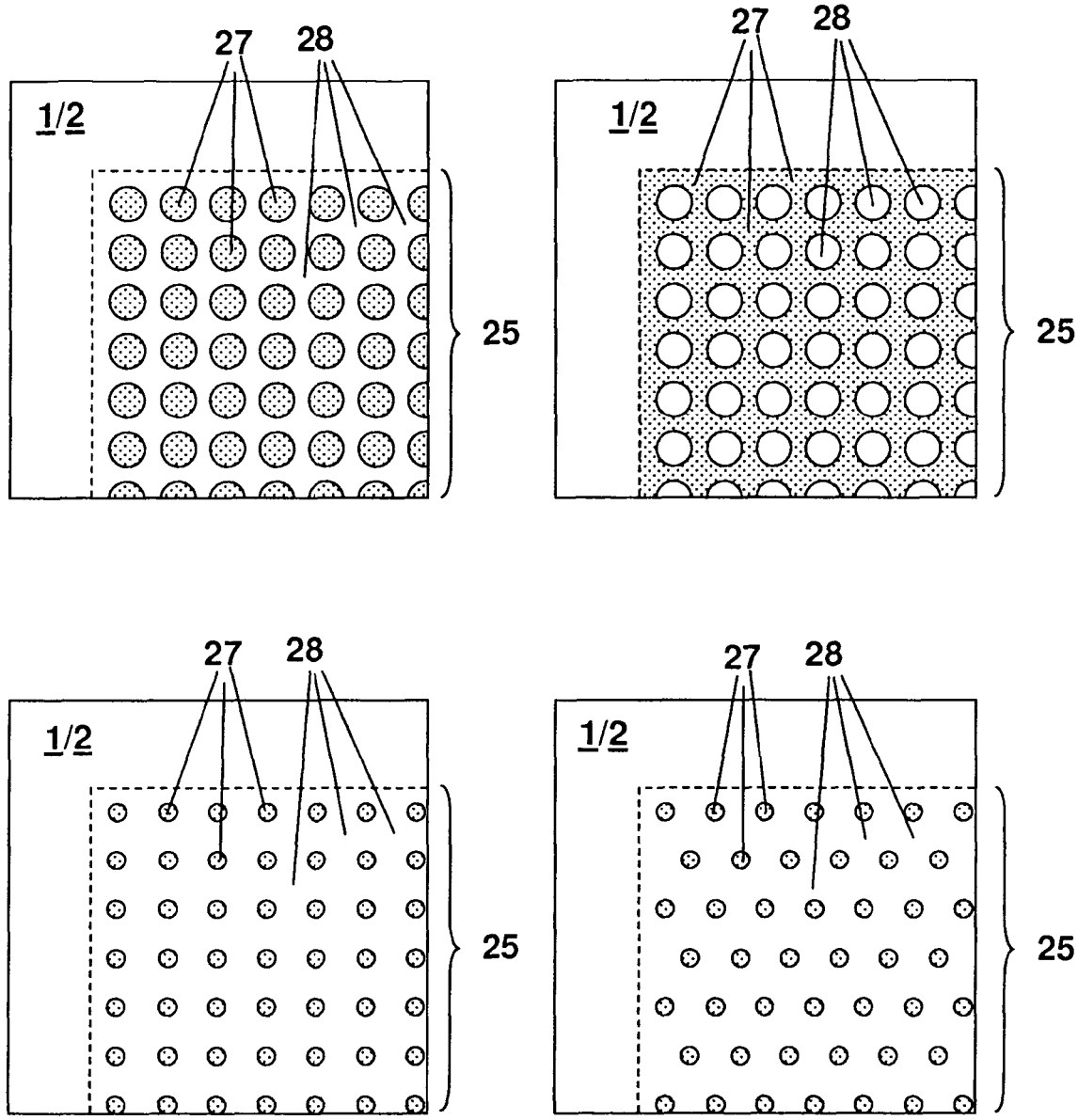
FIG. 4 shows schematic diagrams of top views of several variants of structuring of a first doping area.

FIG. 4 shows several specific embodiments for structuring of first doping area 25, representing examples of implementation of such a structuring. The upper left part of FIG. 4 shows as an example a representation of circular first partial areas 27, in which the dopant that is also used to create second doping area 25 is introduced into substrate material 1. Two partial areas 28 are provided alternatingly between first partial areas 27, no dopant being introduced into substrate material 1 here through a mask. Therefore, on the average there is a smaller quantity of dopant (per area) in first partial structure 21 or first doping area 25, resulting in a smaller thickness of first doping area 25 (after a diffusion process) in comparison with second doping area 35 (see FIG. 3c). An inverse arrangement of the distribution of first partial areas 27 and second partial areas 28 is shown in the upper right part of FIG. 4, where the structuring mask has an inverse design for introduction of the dopant into first and second doping areas 25, 35, so that second partial areas 28, which are shown as circles, indicating the areas where no dopant is introduced into substrate material 1, are completely surrounded by first partial areas 27. To further vary the quantity of dopant in first doping area 25, the relative distribution of the first and second partial areas may also be varied; see lower left diagram in FIG. 4, where first partial areas 27 are smaller and thus there is a reduction in the area into which the dopant concentration required to produce second partial structure 31 or second doping area 35 may penetrate. The lower right part of FIG. 4 shows a hexagonal arrangement of first partial areas 27 and second partial areas 28.

Figure 5:
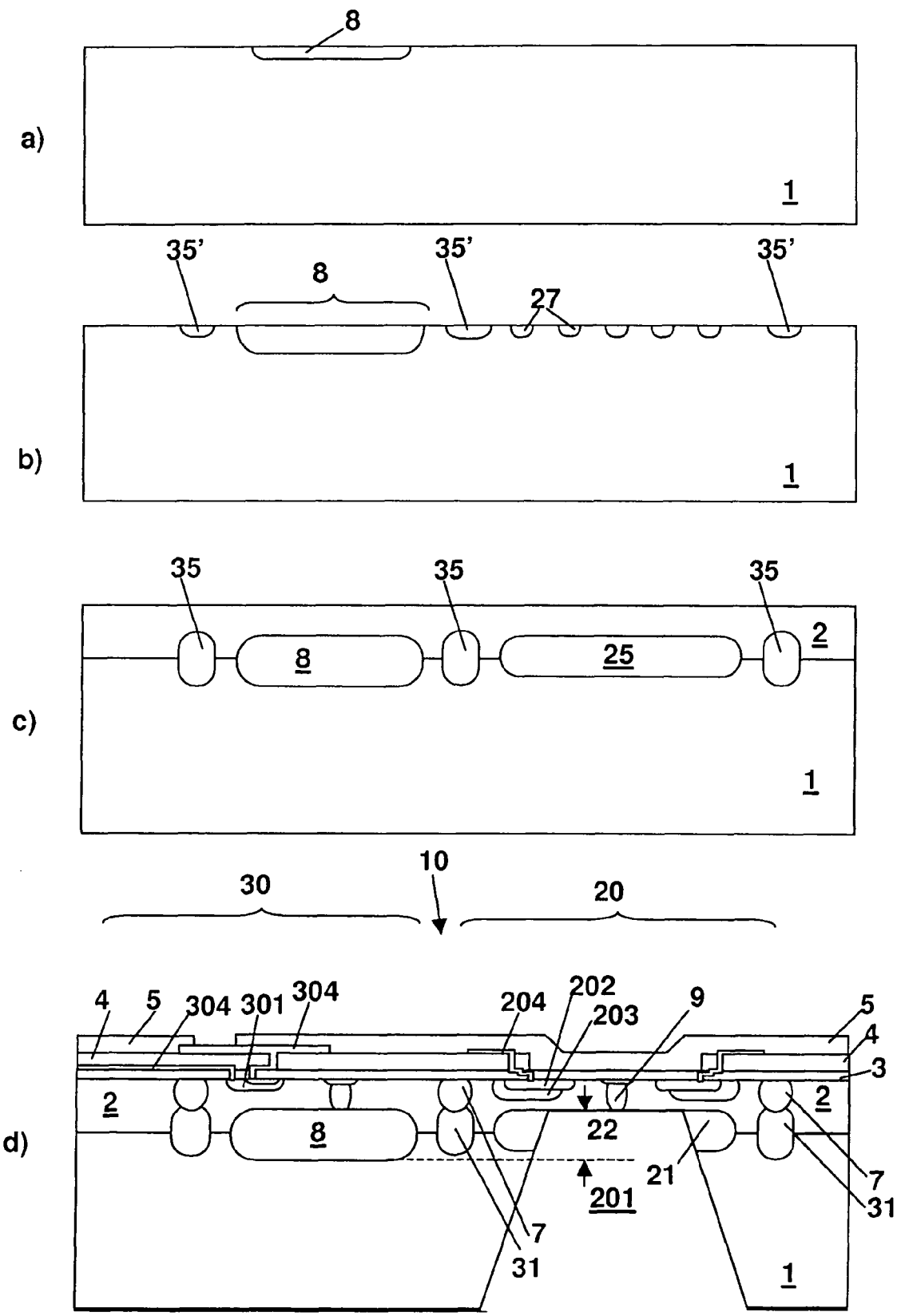
FIG. 5 shows cross-sectional diagrams of various manufacturing steps for creating the second specific embodiment of a sensor array according to the present invention.

FIG. 5 illustrates a second specific embodiment of a manufacturing method according to the present invention for producing a sensor array 10 according to the present invention, a further reduction in diaphragm thickness (see difference 22 in the diaphragm thickness in FIG. 5d) being achieved in the second embodiment by forming first partial structure 21 together with the bottom insulation of circuit area 30, which is labeled with reference numeral 6 in FIGS. 1 and 2 and is thus interpreted as second partial structure 31 in the second embodiment of sensor array 10 according to the present invention. The diffusion used in the first specific embodiment (FIG. 3) of sensor array 10 according to the present invention for second partial structure 31 is also necessary for circuit part 30 of sensor array 10 and is labeled with reference numeral 8 in FIG. 5. The diffusion, which corresponds to a so-called bottom insulation of sensor array 10 and is identified with reference numeral 6 in the first specific embodiment of sensor array 10 according to the present invention and the method for manufacturing same, is used as second partial structure 31 in the second specific embodiment of sensor array 10 according to the present invention and is designed or processed jointly with first partial structure 21. Diffusion of bottom insulation 6 is performed after diffusion of buried layer doping 8, for example, resulting in precursor doping 35' of second doping area 35 (see FIGS. 5a and b). Structuring is again provided in the area of first doping area 25, so that first doping area 25 (see FIG. 5c) receives a smaller quantity of dopant per [unit of] area than second partial structure 31 or second doping area 35. To this end, first partial structure 21 or first doping area 25, is divided alternately into first partial areas 27 and second partial areas 28 in a manner similar to that in the first exemplary embodiment and as illustrated in FIG. 4 as an example. As a result, in the second specific embodiment of sensor array 10 according to the present invention (see FIG. 5d), this results in the boundary between first doping area 25 and epitaxial layer 2 functioning as an etch stop for the formation of cavity 201.

Thus, according to the present invention, the thickness of the diaphragm layer in the area of sensor structure 30 may be varied within a wide range without having to alter processes for manufacturing circuit area 20. The diaphragm thickness may even be varied comparatively continuously, so that optimization of the manufacturing of sensor structure 20 is possible. Furthermore, it is therefore possible according to the present invention to perform an optimal adaptation of the diaphragm thickness to the pressure range to be sensed. It is thus possible according to the present invention to use the diaphragm structure as an absolute pressure sensor or as a differential pressure sensor. It is possible in particular (due to the possibility of creating a comparatively thin diaphragm) to manufacture low-pressure sensors, where a high sensitivity of the pressure sensor arrangement is important, e.g., for tank pressure sensors. Due to the possibility of manufacturing extremely thin diaphragms, this method may be used for sensors where extremely low chip costs are important because a much smaller diaphragm may be implemented due to the smaller thickness of the diaphragm while achieving the same sensitivity of the diaphragm array. According to the present invention, it is advantageous that the diaphragm thickness is controllable and adaptable and nevertheless a reproducible uniform diaphragm thickness is implementable due to the arrangement of a PN etch stop, without requiring any new or additional process steps and mask levels.

Thus, according to the present invention, it is possible to separate optimization of sensor structure 20 from optimization of the circuit structure. Through an appropriate arrangement of first partial areas 27 and second partial areas 28 within first doping area 25, it is possible for a cohesive region (first doping area 25) to be formed after thermal or other diffusion of the dopant, a high concentration of the dopant (first dopant concentration 26) accordingly prevailing in this region to function as an etch stop, but this concentration of dopant is lower than second dopant concentration 36 in second doping area 35 or in second partial structure 31 of sensor array 10 according to the present invention.

Substrate material 1 is a slightly positively doped silicon material in particular. Epitaxial layer 2 is a slightly negatively doped epitaxial layer 2 in particular. Buried layer doping 8

(FIG. 5) is a comparatively highly negatively doped area in particular, so that a PN junction having an etch stop characteristic is obtained between this buried layer doping and substrate 1, in particular when the buried layer over contacting area 9 is kept at a suitable potential with respect to the etching medium for etching cavity 201. The doping of the bottom insulation (doping 6 in FIG. 3, i.e., second doping area 35 in FIG. 5) is provided in particular as a comparatively highly positive doping, thus resulting in etch stop characteristics with respect to the epitaxial layer.

Depending on the desired diaphragm thickness and thus the thickness of first diaphragm area 25, different lattice geometries of first partial areas 27 and second partial areas 28 having different hole-to-web ratios may be used. It is possible in particular to select a rectangular configuration (FIG. 4, not including the lower right arrangement) or a hexagonal arrangement (FIG. 4, lower right arrangement). According to the present invention, other lattice geometries are naturally also conceivable. Any shape may be selected for first partial areas 27 and/or second partial areas 28 according to the present invention. Instead of the circular embodiment illustrated in FIG. 4, for example, a square or rectangular structure or a contiguous structure such as a meandering structure or some other structuring of the first and second partial areas is also possible.

What is claimed is:

1. A method for manufacturing a sensor array, the method comprising:
    a monolithically integrated circuit; and
    a micromechanical sensor structure;
    wherein:
        the sensor structure has a first partial structure,
        the circuit has a second partial structure, a first doping area being produced in a substrate to produce the first partial structure, and a second doping area being created to produce the second partial structure, the first and second doping areas being created in the same doping process,
        during the doping process, a first dopant concentration being introduced into the first doping area and a second dopant concentration being introduced into the second doping area, the first dopant concentration being lower than the second dopant concentration, and
    wherein the first dopant concentration is introduced into the first doping area via a lattice-like structuring of the first partial structure, the lattice-like structuring being provided via alternating first partial areas and second partial areas, the second dopant concentration being introduced into the first partial areas, and no dopant being introduced into the second partial areas.

2. The method of claim 1, wherein the sensor structure has a diaphragm, the thickness of the diaphragm being adjusted by specifying the doping in the first doping area.

3. The method of claim 1, wherein the first partial structure and the second partial structure are manufactured by using the same mask level.

4. The method of claim 1, wherein the first partial structure is produced by a thermal diffusion process starting from the first doping area.

5. A sensor array, comprising:
    a monolithically integrated circuit; and
    a micromechanical sensor structure;
    wherein:
        a first partial structure allocated to the sensor structure has a first doping area,
        a second partial structure allocated to the circuit has a second doping area,
        the first doping area having a first dopant concentration and the second doping area having a second dopant concentration,
        the first dopant concentration being lower than the second dopant concentration, and
    wherein the first dopant concentration in the first doping area has a lattice-like structuring in the first partial structure, the lattice-like structuring being formed alternatingly via first partial areas of a higher dopant concentration and second partial areas of a lower dopant concentration.

6. The sensor array of claim 5, wherein the first partial structure first doping area has a smaller thickness than the second partial structure second doping area.

* * * * *